United States Patent [19]
Takahama et al.

[11] Patent Number: 5,430,330
[45] Date of Patent: Jul. 4, 1995

[54] SEMICONDUCTOR DEVICE, RESIN FOR SEALING SAME AND METHOD OF FABRICATING SAME

[75] Inventors: Shinobu Takahama, Fukuoka; Akinobu Tamaki, Sanda; Satoshi Hirakawa, Fukuoka; Hitoshi Yamano; Teruki Hyougatani, both of Sanda, all of Japan

[73] Assignee: Mitsubishi Denki Kabushiki Kaisha, Tokyo, Japan

[21] Appl. No.: 77,762

[22] Filed: Jun. 18, 1993

[30] Foreign Application Priority Data

Jun. 22, 1992 [JP] Japan .................. 4-162804

[51] Int. Cl.$^6$ .......................... C08G 59/22
[52] U.S. Cl. .................. 257/788; 257/789; 257/795
[58] Field of Search ........... 257/787, 712, 789, 795, 257/788

[56] References Cited
U.S. PATENT DOCUMENTS

| | | |
|---|---|---|
| 4,043,969 | 8/1977 | Sporck . |
| 4,884,126 | 11/1989 | Harada et al. ............. 257/712 |
| 5,298,548 | 3/1994 | Shiobara et al. ........... 257/787 |

FOREIGN PATENT DOCUMENTS 1694700 10/1970 Germany .
63-108021 5/1988 Japan .

OTHER PUBLICATIONS

Patent Abstracts of Japan, vol. 11, No. 20 (E-472), Jan. 20, 1987, JP-A-61 191 056, Aug. 25, 1986.
Patent Abstracts of Japan, vol. 15, No. 348, (E-1107), Sep. 4, 1991, JP-A-03 135 039, Jun. 10, 1991.

*Primary Examiner*—William Mintel
*Assistant Examiner*—Roy Potter
*Attorney, Agent, or Firm*—Oblon, Spivak, McClelland, Maier, & Neustadt

[57] ABSTRACT

A semiconductor device where electrode terminals (2), elements (6) and wires (7) are disposed on a base plate (5) of a case (4) filled with only epoxy resin (1). The epoxy resin (1) contains impurities such as halogen and alkaline metallic salts in an amount of not more than 5 ppm and has a linear expansion coefficient of $5 \times 10^{-6}$ to $25 \times 10^{-6}$ when hardened. The semiconductor device provides for direct sealing of the components, its size and cost are therefore reduced.

25 Claims, 3 Drawing Sheets

SEMICONDUCTOR DEVICE, RESIN FOR SEALING SAME AND METHOD OF FABRICATING SAME

BACKGROUND OF THE INVENTION

1. Field of the Invention

The present invention relates to a semiconductor device wherein electronic components disposed within a case is sealed with resin such as an intelligent high-power module and, more particularly, to a semiconductor device which is less costly and is small in size, and to a resin to be used therefor and a method of fabricating the same.

2. Description of the Background Art

Electronic components of semiconductor devices include thin-film resistors, ICs, hybrid ICs, transistors, diodes and the like. For increasing the reliability of semiconductor devices under various environmental conditions, the electronic components mounted on a substrate are housed in a package. In the semiconductor art, packages have generally been shifted toward resin packages which are less costly.

Methods of packaging electronic components with resin include transfer molding, casting, dipping, powder coating, dropping, tabletting, potting and the like. In particular, portions and modules having a fine structure are protected by a precoating material (partial protective coat) or a buffer coating material (entire protective coat).

In particular, transistors and hybrid components such as power modules, transistor modules, hybrid ICs are coated with the entire protective coat and are then sealed by pouring and hardening a normal liquid epoxy resin.

For example, power components are generally protected overall using as a buffer coating material a gelatinous material such as silicon gel, and then epoxy resin or the like is poured thereon, to achieve the sealing.

FIG. 3 is a cross-sectional view of a conventional resin-sealed semiconductor device. A semiconductor device 20 comprises electrode terminals 2, elements 6 and wires 7 which are disposed within a case 4 having a base plate 5. The electrode terminals 2, elements 6 and wires 7 are mounted on the base plate 5, and silicon gel 8 are poured so as to surround the mounted portions of the components and bent portions 3 of the electrode terminals 2. Epoxy resin 1 is filled in the remaining interior of the case 4 which overlies the silicon gel 8. Filling the whole interior of the case 4 with only the normal epoxy resin decreases the reliability of the device due to the stresses generated when the resin is hardened and the effects of impurity ions. Thus the silicon gel 8 serving as a buffer is used.

However, the silicon gel is costly and requires the pouring and hardening processes thereof, resulting in high costs for providing the semiconductor device 20. Another problem is the difficulty in size reduction in the direction of the thickness because of the two-layer structure having the silicon gel 8 and the resin 1.

SUMMARY OF THE INVENTION

According to the present invention, a semiconductor device comprises: (a) a box-shaped case having a bottom; (b) electronic components disposed on the bottom; and (c) resin filled and hardened in the case for sealing the electronic components, the resin (c) containing (c-1) 10 to 30% by weight of epoxy resin ingredient, and (c-2) 90 to 70% by weight of filler ingredient in the form of particles, the linear expansion coefficient of the resin when hardened being $5 \times 10^{-6}$ to $25 \times 10^{-6}$.

The semiconductor device in which the electronic components are sealed directly with resin without a gel layer is reduced in size and is economical.

In addition, the semiconductor device is fabricated easily because it does not require the step of pouring and hardening gel. The semiconductor device may include no S-bends of the electrode terminals because of the small stress of the resin.

Preferably, the epoxy resin ingredient (c-1) contains (c-1-1) 100 parts of epoxy resin; (c-1-2) 0 to 100 parts of acid anhydride; and (c-1-3) 0.1 to 10 parts of catalyst.

Preferably, the epoxy resin (c-1-1) contains at least one material selected from the group consisting of bisphenol A, cycloaliphatic epoxy, and bisphenol F.

Preferably, the acid anhydride (c-1-2) contains at least one material selected from the group consisting of methyl THPA, methyl MMPA, MNA, and DDSA.

Preferably, the catalyst (c-1-3) contains at least one material selected from the group consisting of imidazole derivatives, tertiary amine and metallic salts.

Preferably, the filler ingredient (c-2) contains at least one material selected from the group consisting of fused quartz, quartz, alumina and aluminum nitride.

Preferably, the resin (c) further contains 3 to 10% by weight of fire retardant ingredient selected from the group consisting of antimony trioxide and bromine compounds.

Preferably, the total amount of halogen and alkaline metal ingredient contained in the resin (c) is not more than 10 PPM.

Preferably, the thermal conductivity of the resin (c) when hardened is 0.5 to 20 Kcal/m.h.° C.

Preferably, the adhesive strength under shear of the, resin (c) when hardened is 100 to 250 Kg/cm² (Fe/Fe).

Preferably, the transverse rupturing strength of the resin (c) when hardened is 7 to 20 Kg/mm².

Preferably, the viscosity of the resin (c) is 5000 to 100000 cps (at 25° C.).

Preferably, the hardening time of the resin (c) is 0.1 to 5 hours at the temperature of 125° C.

The present invention is also intended for a resin for sealing a semiconductor device, the resin having a linear expansion coefficient of $5 \times 10^{-6}$ to $25 \times 10^{-6}$ when hardened. According to the present invention, the resin comprises: (a) 10 to 30% by weight of epoxy resin ingredient containing (a-1) 100 parts of epoxy resin selected from the group consisting of bisphenol A, cycloaliphatic epoxy and bisphenol F, (a-2) 0 to 100 parts of at least one acid anhydride selected from the group consisting of methyl THPA, methyl MMPA, MNA and DDSA, and (a-3) 0.1 to 10 parts of at least one catalyst selected from the group consisting of imidazole derivatives, tertiary amine and metallic salts; and (b) 90 to 70% by weight of at least one filler ingredient in the form of particles selected from the group consisting of fused quartz, quartz, alumina and aluminum nitride.

Since the resin of the present invention has a small linear expansion coefficient, the electronic components of the semiconductor device, if directly scaled with resin, are not stressed when the resin is hardened, causing no warpage of the semiconductor device.

Preferably the resin further comprises 3 to 10% by weight of at least one fire retardant ingredient selected from the group consisting of antimony trioxide and bromine compounds.

Preferably, the total amount of halogen and alkaline, metal ingredient contained in the resin is not more than 10 PPM.

Preferably, the thermal conductivity of the resin when hardened is 0.5 to 20 Kcal/m.h.° C.

Preferably, the adhesive strength under shear of the resin when hardened is 100 to 250 Kg/cm² (Fe/Fe).

Preferably, the transverse rupturing strength of the resin when hardened is 7 to 20 Kg/mm².

Preferably, the viscosity of the resin is 5000 to 100000, cps (at 25° C.).

Preferably, the hardening time of the resin is 0.1 to 5 hours at the temperature of 125° C.

The present invention is also intended for a method of fabricating a semiconductor device. According to the present invention, the method comprises the steps of: (a) disposing electronic components in a bottom of a box-shaped case; and (b) filling and hardening a resin to seal the electronic components, the resin containing 10 to 30% by weight of epoxy resin ingredient and 90 to 70% by weight of filler ingredient in the form of particles, the linear expansion coefficient of the resin when hardened being $5 \times 10^{-6}$ to $25 \times 10^{-6}$.

The method of the present invention does not comprise the step of pouring gel, thereby requiring only a short time efficiently.

According to the present invention, the linear expansion coefficient indicates the rate of expansion per degree Celsius. For example, a $5 \times 10^{-6}$ linear expansion coefficient may be indicated as $5 \times 10^{-6}/°$ C.

An object of the present invention is to provide a semiconductor device which is less costly than conventional semiconductor devices and is small in size, and a resin to be used therefor.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
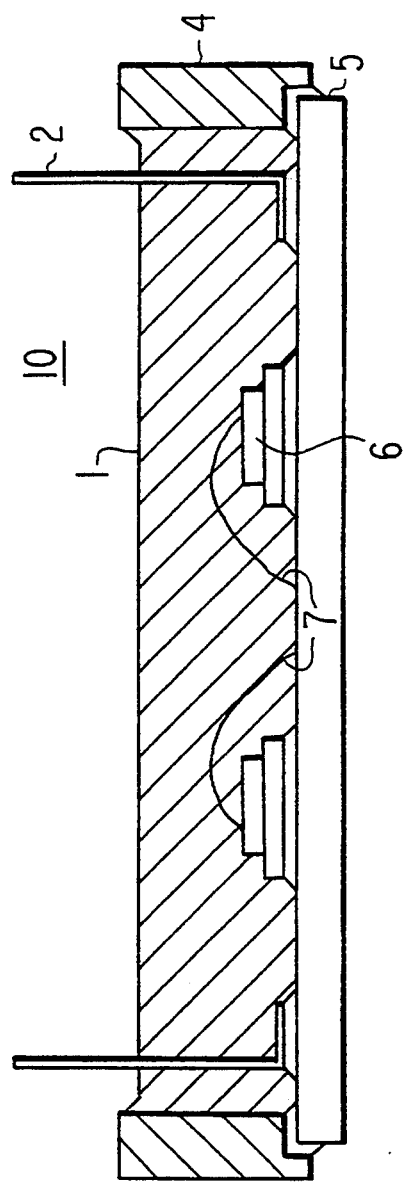
FIG. 1 is a cross-sectional view of a semiconductor device according to a preferred embodiment of the present invention.
Figure 2:
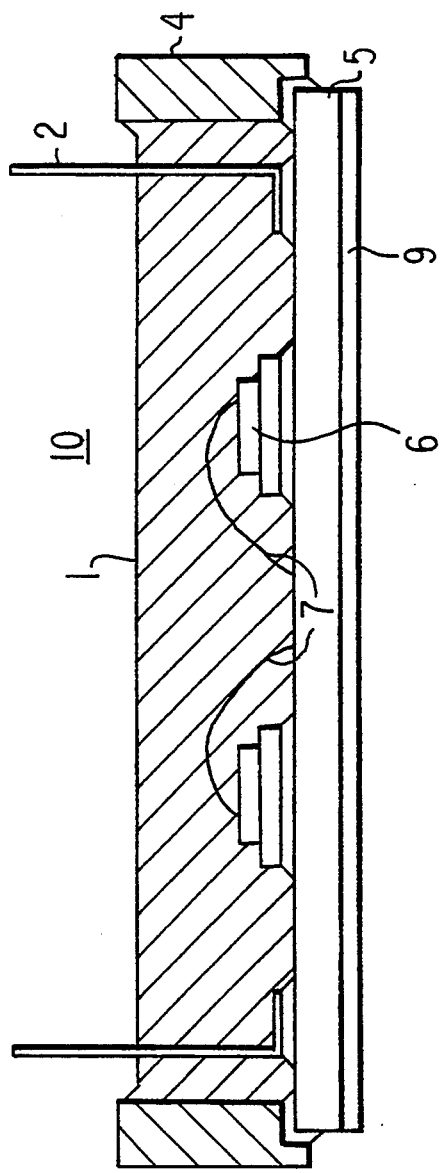
FIG. 2 cross-sectional view of the semiconductor device according to another preferred embodiment, of the present invention.

A semiconductor device 10 shown in FIG. 1 is fabricated by the processes to be described below. As shown in FIG. 1, elements 6, wires 7 and electrode terminals 2 are mounted within a case 4 having a base plate 5 serving as a bottom. For sealing the components, the case 4 is filled with resin 1 according to the present invention. Preferably, a heat sink 9 is formed on the outer surface of the base plate 5 serving as the bottom of the case 4, as shown in FIG. 2.

The semiconductor device 10 is fabricated through the steps of mounting the elements 6, wires 7 and electrode terminals 2 on the base plate 5 of the box-shaped case 4 and filling and hardening the resin of the present invention to be described in detail later in the case 4 so as to seal the electronic components.

A resin having an ion impurity concentration of 1 PPM is provided which is a blend of three ingredients: an epoxy resin ingredient containing, by weight, 40 parts of bisphenol A, 60 parts of cycloaliphatic epoxy, 80 parts of methyl THPA and 1 part of imidazole; a filler ingredient containing 700 parts by weight of quartz (containing 30 wt. % of 100 μtm crushed quartz, 60 wt. % of 20 μm spherical quartz, and 10 wt. % of 0.5 μm spherical quartz); and a fire retardant ingredient containing, by weight, 40 parts of HBB and 20 parts of antimony trioxide. The resin that is hardened has a linear expansion coefficient of $18 \times 10^{-6}$, a thermal conductivity of 0.7 Kcal/m.h.° C., a drying time of three hours at the temperature of 125° C., a transverse rupturing strength of 12 Kg/mm², and a viscosity of 50000 cps at the temperature of 25° C. The filler ingredient may be 1000 parts by weight of alumina (containing 30 wt. % of 100 μm crushed alumina, 60 wt. % of 20 μm spherical alumina, and 10 wt. % of 0.5 μm spherical alumina) or 1000 parts by weight of alumina nitride (containing 30 wt. % of 100 μm crushed alumina nitride, 60 wt. % of 20 μm spherical alumina nitride, and 10 wt. % of 0.5 μm spherical alumina nitride) in place of the 700 parts by weight of quartz. The resin containing alumina has a purity of 1 PPM, a linear expansion coefficient of $22 \times 10^{-6}$, a thermal conductivity of 1.7 Kcal/m.h.°C., a drying time of three hours at the temperature of 125° C., a transverse rupturing strength of 12 Kg/mm², and a viscosity of 50000 cps at the temperature of 25° C.

Three resins for comparison are provided: a liquid epoxy resin A having an ion impurity concentration of 10 PPM and a linear expansion coefficient of $20 \times 10^{-6}$; a liquid epoxy resin B having an ion impurity concentration of 1 PPM and a linear expansion coefficient of $35 \times 10^{-6}$; and a liquid epoxy resin C having an ion impurity concentration of 10 PPM and a linear expansion coefficient of $35 \times 10^{-6}$. Then four modules each mounted on the bottom of a case are provided. The foregoing four resins (the resin using quartz of the preferred embodiment, the resin A, the resin B and the resin C) are poured into the four cases, respectively, and are hardened for three hours at the temperature of 125° C., to provide the semiconductor devices 10 as shown in FIG. 1. Also provided is the conventional semiconductor device 20 of FIG. 2 using the resin A and silicon gel.

The results of the experiment of the devices are shown in Table 1.

TABLE 1

| packaging methods | measuring items* | | | |
|---|---|---|---|---|
| | heat cycle 1000 cycles −40 to 125 °C. | 121° C. 2 atm. water 1000 hrs. | 150° C. high temperature kept for 1000 hrs. | ON/OFF repetitive test 10000 time |
| present invention (preferred embodiment) | o | o | o | o |
| resin A (for comparison) | o | x | o | x |
| resin B (for comparison) | x | o | o | x |
| resin C (for comparison) | x | x | o | x |
| silicon gel & resin A (for | o | x | x | x |

TABLE 1-continued

| packaging methods | heat cycle 1000 cycles −40 to 125 °C. | 121° C. 2 atm. water 1000 hrs. | 150° C. high temperature kept for 1000 hrs. | ON/OFF repetitive test 10000 time |
|---|---|---|---|---|
| comparison) | | | | |

*Test for leak current and breakdown voltage
o is normal, and x is abnormal

Figure 3:
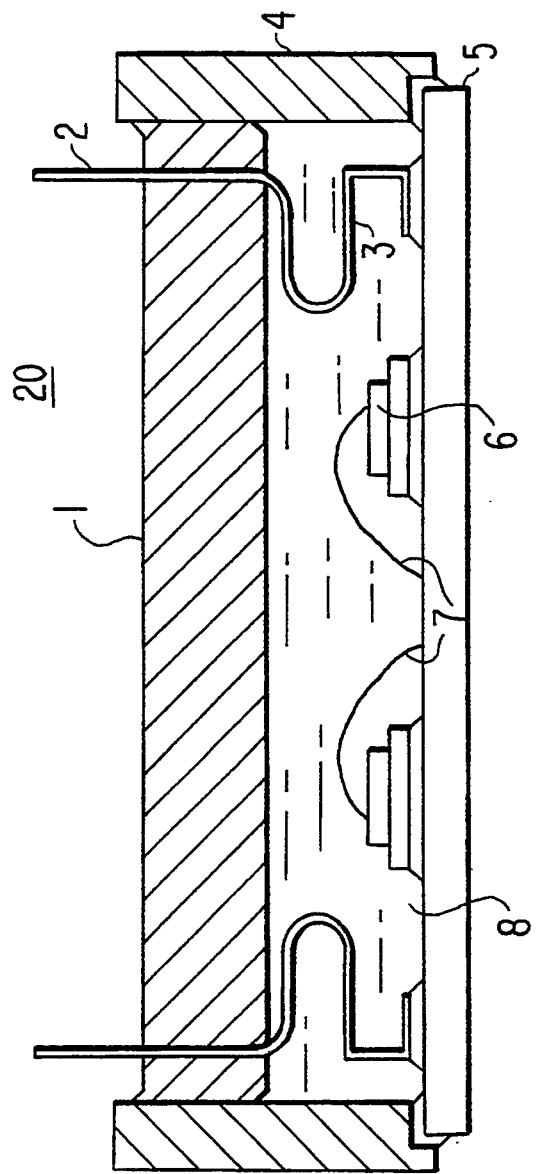
FIG. 3 is a cross-sectional view of a conventional semiconductor device.

Table 2 shows characteristic data of the semiconductor device of FIG. 1 fabricated using the conventional resin (the conventional method (1)), the semiconductor device of FIG. 3 fabricated using the conventional resin (the conventional method (2)), and the semiconductor device of FIG. 1 fabricated using the resin of the present invention (the present invention).

fire retardant ingredient may be employed including bromine compounds, antimony trioxide, and HBB.

Bisphenol A has a great strength and a strong adhesion. Cycloaliphatic epoxy has a high tracking resistance, a high purity, and a low viscosity. Methyl THPA has a high tracking resistance, a high purity, and a low viscosity. Imidazole has a rapid hardenability. Metal salts are noncorrosive. Fused quartz has a low linear expansion coefficient. Alumina has a high thermal conductivity. Aluminum nitride has a very high thermal conductivity. HBB is less harmful.

According to the present invention, when the amount of the filler ingredient of the sealing resin is less than 70% by weight, the hardened resin has poor properties. When the amount of the filler ingredient of the sealing resin is more than 90% by weight, the resin is not hardened in some cases, providing the low strength of the

TABLE 2

| CHARACTERISTICS | CONVENTIONAL METHOD (1) WITHOUT GEL | CONVENTIONAL METHOD (2) WITH GEL | REQUIRED PROPERTIES | PRESENT INVENTION WITHOUT GEL | |
|---|---|---|---|---|---|
| 1. WIRE CUTOFF | x | o | *INCREASE IN VOLTAGE | GOOD | o |
| 2. CHARACTERISTIC (STRESS) | x | o | *INCREASE IN ELECTRO-MAGENTIC | GOOD | o |
| 3. SHRINKAGE | x | o | *INCREASE IN TEMPERATURE | GOOD | o |
| 4. PURITY | x | o | | GOOD | o |
| 5. ELECTRIC RESISTANCE | Δ | x | *HIGHER-DENSITY PACKAGING | INCREASED | o |
| 6. SOLDER (CHIP) CRACK | Δ | x | *INCREASE IN MOISTURE RESISTANCE | REDUCTION IN α | o |
| 7. HYGROSCOPICITY | Δ | x | *HIGHER-TEMPERATURE CONDUCTION | INCREASED | o |
| 8. THERMAL CONDUCTIVITY | Δ | x | *INCREASE IN INSULATION | INCREASED | o |
| 9. ELECTROMAGNETIC VIBRATION | o | x | *RATIONALIZATION | PREVENTED | o |
| 10. EXPANSION OF GEL | o | x | *COST REDUCTION | ELIMINATED | o |
| 11. S-BENT LEAD | o ABSENT | x PRESENT | *SIZE REDUCTION | ABSENT | o |
| 12. DOUBLE STRUCTURE | o SINGLE | x DOUBLE | (TO OVERCOME DRAWBACKS OF | SINGLE THIN | o |
| 13. REACTIVITY (HARDENING FAILURE) | o | x | CONVENTIONAL METHODS (1) & (2), | NONE | o |
| 14. NUMBER OF STEPS | o | x | MATERIAL STRUCTURES & | REDUCED | o |
| 15. EXTERNAL IMPACT | o | x | PROCESSES ARE CHANGED) | NONE | o |
| 16. COST | o | x | | LOW | o |

The conventional semiconductor device 20 of FIG. 3 is 11 mm thick, however, the semiconductor device 10 of the present invention is reduced in size, i.e., 7 to 8 mm thick. Since the resin 1 of the semiconductor device 10 that is hardened has a low linear expansion coefficient and a small stress generated, the electrode terminals 2 of the semiconductor device 10 need not have bent portions for alleviation of stresses.

According to the present invention, the epoxy resin may be employed including bisphenol A, bisphenol F and cycloaliphatic epoxy. Acid anhydride may be employed including methyl THPA, methyl MMPA, MNA, and DDSA. Catalysts may be employed including imidazole derivatives, tertiary amine, and metallic salts. The filler ingredient may be employed including fused quartz, quartz, alumina, and alumina nitride. The hardened resin and low thermal deformation temperatures. Less than 3% by weight of fire retardant ingredient in the resin results in the flame retardant performance of resin which is lower than the V-0 grade of UL94, so that the resin becomes combustible. More than 10% by weight of fire retardant ingredient in the resin decreases the physical properties of the hardened resin. A smaller amount of acid anhydride in the epoxy resin ingredient causes a tendency to increase the viscosity and decrease the physical properties of the hardened resin. More than 100 parts by weight of acid anhydride provides low physical properties of the hardened resin and low thermal deformation temperatures. Less than 0.1 part by weight of catalyst in the epoxy resin ingredient required much time for hardening, and more than 10 parts by weight thereof provides low physical properties and low heat resistance of the hardened resin.

A linear expansion coefficient of less than $5\times10^{-6}$ is preferable but impracticable. A linear expansion coefficient of more than $25\times10^{-6}$ increases the stress generated, causing cutoff of aluminum wires easily. When the total amount of halogen and alkaline metal ingredient contained in the sealing resin is more than 10 PPM, corrosion and malfunction of the silicon chip occur when it absorbs moisture. The hardened resin, if having a thermal conductivity of less than 0.5 Kcal/m.h.° C., dissipates less heat, resulting in increase in temperature. A thermal conductivity of more than 20 Kcal/m.h.° C. of the hardened resin is preferable but almost impracticable. When the adhesive strength under shear of the hardened resin is less than 100 kg/cm² (Fe/Fe), the case peels off or is removed from aluminum or the chip. The adhesive strength under shear of more than 250 Kg/cm² is preferable but is difficult to be achieved. When the transverse rupturing strength of the hardened resin is less than 7 Kg/mm², cracks occur in the resin. The resins having a transverse rupturing strength of more than 20 Kg/mm² when hardened are preferable, however, rare. The viscosity of the resin is more preferably less than 5000 cps (at 25° C.), however, the amount of filler must be decreased to achieve it, which does not permit other preferred effects to be obtained. The resin having a viscosity of 100000 cps (at 25° C.) has a poor workability. When it takes longer than five hours to harden the resin at the temperature of 125° C., many goods in process are made, resulting in a poor workability. When the epoxy resin has a 0–100:100 ratio by weight of bisphenol A to cycloaliphatic epoxy, the sealing resin when hardened has a high tracking resistance and a great strength in accordance with the present invention.

Preferably, the resin of the present invention comprises 15 to 25% by weight of epoxy resin ingredient and 85 to 75% by weight of filler ingredient. A preferable linear expansion coefficient for the foregoing purposes is $10\times10^{-6}$ to $22\times10^{-6}$. The epoxy resin ingredient more preferably comprises 100 parts of epoxy resin, 50 to 100 parts of acid anhydride and 0.5 to 5 parts of catalyst. More preferably, the epoxy resin is cycloaliphatic epoxy. Preferably, bisphenol A and cycloaliphatic epoxy are used such that the weight ratio of bisphenol A to cycloaliphatic epoxy is 0–100:100. Acid anhydride is more preferably selected from the group consisting of methyl THPA and MNA. The catalyst is more preferably selected from the group consisting of imidazole derivatives and metallic salts. The filler ingredient is more preferably selected from the group consisting of fused quartz and alumina. The fused quartz preferably includes crushed particles and spherical particles. The spherical particles include smaller and larger particles in mixed relation. Specifically, the diameter of the crushed particles is 3 to 30 μm, preferably 5 to 15 μm; the diameter of the smaller spherical particles is less than 3 μm; and the diameter of the larger spherical particles is 20 to 300 μm, preferably 30 to 150 μm. The crushed particles have excellent adhesive properties to the resin ingredient to increase the strength of the resin, and the spherical particles provide flowability. In particular, submicron spherical particles provide a great degree of sliding properties. The resin preferably contains 5 to 10% by weight of fire retardant ingredient. More preferably, the fire retardant ingredient is at least one material selected from the group consisting of antimony trioxide and HBB. More preferably, the total amount of halogen and alkaline metal ingredient contained in the resin is not more than 3 PPM. The thermal conductivity of the hardened resin for sealing is more preferably 0.7 to 2.0 Kcal/m.h.° C. The adhesive strength under shear of the hardened resin is more preferably 150 to 250 Kg/cm² (Fe/Fe). The transverse rupturing strength of the hardened resin is more preferably 10 to 20 Kg/mm². The viscosity of the sealing resin is more preferably 5000 to 50000 cps (at 25° C.). The hardening time of the resin at the temperature of 125° C. is more preferably 0.1 to 3 hours.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a box-shaped case having a bottom;
   electronic components provided on an inner surface of said bottom; and
   a resin, filled and hardened in said box-shaped case for directly sealing said electronic components, said resin containing
   10 to 30 percent by weight of an epoxy resin ingredient containing 100 parts of epoxy resin which contains only at least one material selected from the group consisting of bisphenol A, cycloaliphatic epoxy, and bisphenol F, 0 to 100 parts of acid anhydride, and 0.1 to 10 parts of a catalyst, and
   90 to 70 percent by weight of a filler ingredient in the form of particles containing at least one material selected from the group consisting of fused quartz including crushed particles and spherical particles, quartz, alumina, and aluminum nitride,
   wherein said spherical particles of said fused quartz include smaller particles having diameters of less than 3 μm and larger particles having diameters in the range of 20–300 μm, preferably 30–150 μm, mixed together, and said crushed particles of said fused quartz have a diameter in the range of 3 to 30 μm, and
   wherein a linear expansion coefficient of said resin when hardened is in the range of $5\times10^{-6}$ to $25\times10^{-6}/°C$.

2. The semiconductor device of claim 1, further comprising a heat sink provided on an outer surface of said bottom.

3. The semiconductor device of claim 1, wherein said linear expansion coefficient is in the range of $10\times10^{-6}$ to $22\times10^{-6}/°$ C.

4. The semiconductor device of claim 1, wherein said epoxy resin ingredient contains
   100 parts of epoxy resin;
   50 to 100 parts of acid anhydride; and
   0.5 to 5 parts of a catalyst.

5. The semiconductor device of claim 1, wherein said epoxy resin essentially contains cycloaliphatic epoxy.

6. The semiconductor device of claim 5, wherein a ratio of bisphenol A to cycloaliphatic epoxy is 0–100:100 by weight.

7. The semiconductor device of claim 1, wherein said acid anhydride contains at least one material selected from the group consisting of methyl THPA, methyl MMPA, MNA, and DDSA.

8. The semiconductor device of claim 7, wherein said acid anhydride contains at least one material selected from the group consisting of methyl THPA and MNA.

9. The semiconductor device of claim 7, wherein said catalyst contains at least one material selected from the group consisting of imidazole derivatives, tertiary amine, and metallic salts.

10. The semiconductor device of claim 9, wherein said catalyst contains at least one material selected from the group consisting of imidazole derivatives and metallic salts.

11. The semiconductor device of claim 1, wherein said filler ingredient contains at least one material selected from the group consisting of fused quartz and alumina.

12. The semiconductor device of claim 1, wherein said resin further contains 3 to 10% by weight of a fire retardant ingredient selected from the group consisting of antimony trioxide and bromine compounds.

13. The semiconductor device of claim 12, wherein said fire retardant ingredient is at least one material selected from the group consisting of antimony trioxide and HBB.

14. The semiconductor device of claim 12, wherein a total amount of halogen and an alkaline metal ingredient contained in said resin is not more than 10 PPM.

15. The semiconductor device of claim 14, wherein said total amount of halogen and an alkaline metal ingredient contained in said resin is not more than 3 PPM.

16. The semiconductor device of claim 14, wherein a thermal conductivity of said resin when hardened is in the range of 0.5 to 20 Kcal/m.h.°C.

17. The semiconductor device of claim 16, wherein wherein said thermal conductivity of said resin when hardened is in the range of 0.7 to 2.0 Kcal/m.h.° C.

18. The semiconductor device of claim 16, wherein an adhesive strength under shear of said resin when hardened is in the range of 100 to 250 $Kg/cm^2$ (Fe/Fe).

19. The semiconductor device of claim 18, wherein said adhesive strength under shear of said resin when hardened is in the range of 150–250 $Kg/cn^2$ (Fe/Fe).

20. The semiconductor device of claim 18, wherein a transverse rupturing strength of said resin when hardened is in the range of 7 to 20 $Kg/mm^2$.

21. The semiconductor device of claim 20, wherein said transverse rupturing strength of said resin when hardened is in the range of 10–20$Kg/mm^2$.

22. The semiconductor device of claim 20, wherein a viscosity of said resin is in the range of 5,000 to 100,000 cps at a temperature of 25° C.

23. The semiconductor device of claim 22, wherein said viscosity of said resin is in the range of 5,000 to 50,000 cps at a temperature of 25° C.

24. The semiconductor device of claim 22, wherein a hardening time of said resin is in the range of 0.1 to 5 hours at a temperature of 125° C.

25. The semiconductor device of claim 24, wherein said hardening time of said resin is in the range of 0.1 to 3 hours at a temperature of 125° C.

* * * * *

UNITED STATES PATENT AND TRADEMARK OFFICE
CERTIFICATE OF CORRECTION

PATENT NO.  : 5,430,330
DATED       : July 4, 1995
INVENTOR(S) : Shinobu TAKAHAMA, et al.

It is certified that error appears in the above-indentified patent and that said Letters Patent is hereby corrected as shown below:

On the title page, Item [75], the fifth inventor's last name should read:

--Hyogatani--

Signed and Sealed this

Twenty-fourth Day of October, 1995

Attest:

BRUCE LEHMAN

*Attesting Officer*        Commissioner of Patents and Trademarks